US009896045B2

(12) United States Patent
Hoyer et al.

(10) Patent No.: US 9,896,045 B2
(45) Date of Patent: Feb. 20, 2018

(54) TOUCH ACTIVATED, WIRELESS SWITCHES

(71) Applicants: Thomas Hoyer, Warminster, PA (US); Teri Rex, Lakewood Ranch, FL (US); Simon Cordner, Voorhees, NJ (US)

(72) Inventors: Thomas Hoyer, Warminster, PA (US); Teri Rex, Lakewood Ranch, FL (US); Simon Cordner, Voorhees, NJ (US)

(73) Assignee: Carling Technologies, Inc., Plainville, CT (US)

( * ) Notice: Subject to any disclaimer, the term of this patent is extended or adjusted under 35 U.S.C. 154(b) by 652 days.

(21) Appl. No.: 13/826,352

(22) Filed: Mar. 14, 2013

(65) Prior Publication Data
US 2013/0241280 A1    Sep. 19, 2013

Related U.S. Application Data

(60) Provisional application No. 61/611,383, filed on Mar. 15, 2012.

(51) Int. Cl.
*B60R 16/03* (2006.01)
*H03K 17/96* (2006.01)
(Continued)

(52) U.S. Cl.
CPC ........... *B60R 16/03* (2013.01); *H03K 17/962* (2013.01); *H04W 4/005* (2013.01);
(Continued)

(58) Field of Classification Search
CPC .. G01G 23/00; B60L 1/00; B60L 3/00; B60R 16/03; H03K 17/962; H03K 2217/94089;
(Continued)

(56) References Cited

U.S. PATENT DOCUMENTS 5,699,051 A * 12/1997 Billig ................. H01R 13/6691
340/656
6,158,867 A    12/2000 Parker et al.
(Continued)

FOREIGN PATENT DOCUMENTS

WO    2006102537 A2    9/2006

OTHER PUBLICATIONS

International Search Report and Written Opinion of the International Searching Authority Application No. PCT/US2013/021912 Completed: May 10, 2013; dated May 31, 2013 10 pages.

*Primary Examiner* — Daniel Kessie
(74) *Attorney, Agent, or Firm* — St. Onge Steward Johnston & Reens, LLC

(57) ABSTRACT

Modular wireless switch system for use in an aircraft, which may include an integrated LED backlight. The system includes a master module having a power supply, a switch, and a wireless communicator configured to communicate a switch state. The system also includes a slave module connectable to the master module, which has a second switch and which is configured to communicate a second switch state using the wireless communicator. All wireless communications may be handled by the master module using a protocol such as ZigBee™. All communications from the slave module may be transmitted to the master module via a wired bus. Additional slave modules are connectable to the bus as desired.

20 Claims, 9 Drawing Sheets

(51) Int. Cl.
  *H04W 4/00*   (2018.01)
  *H04L 29/08*  (2006.01)

(52) U.S. Cl.
  CPC .............. *H03K 2217/94089* (2013.01); *H03K 2217/960755* (2013.01); *H03K 2217/960785* (2013.01); *H04L 67/12* (2013.01)

(58) Field of Classification Search
  CPC ...... H03K 2217/960755; H03K 2217/960785; H04W 4/005; H04L 67/12
  USPC ...................................... 307/10.1, 10.8, 9.1
  See application file for complete search history.

(56) References Cited

U.S. PATENT DOCUMENTS

| | | | |
|---|---|---|---|
| 6,229,433 B1* | 5/2001 | Rye | H04L 12/2803 340/12.5 |
| 7,133,270 B2 | 11/2006 | Driehorn et al. | |
| 7,598,625 B2* | 10/2009 | Yu | H02J 13/0003 307/131 |
| 2008/0066971 A1 | 3/2008 | Whang et al. | |
| 2008/0238159 A1* | 10/2008 | Parnis | B60N 2/5685 297/180.12 |
| 2011/0001722 A1* | 1/2011 | Newman | G06F 3/03547 345/174 |
| 2011/0006611 A1 | 1/2011 | Baarman et al. | |
| 2011/0080046 A1* | 4/2011 | Lee | G06F 1/26 307/39 |
| 2011/0148192 A1* | 6/2011 | Brooks | B60R 25/045 307/10.3 |
| 2012/0239773 A1* | 9/2012 | Blustein | H04L 12/2818 709/208 |

\* cited by examiner

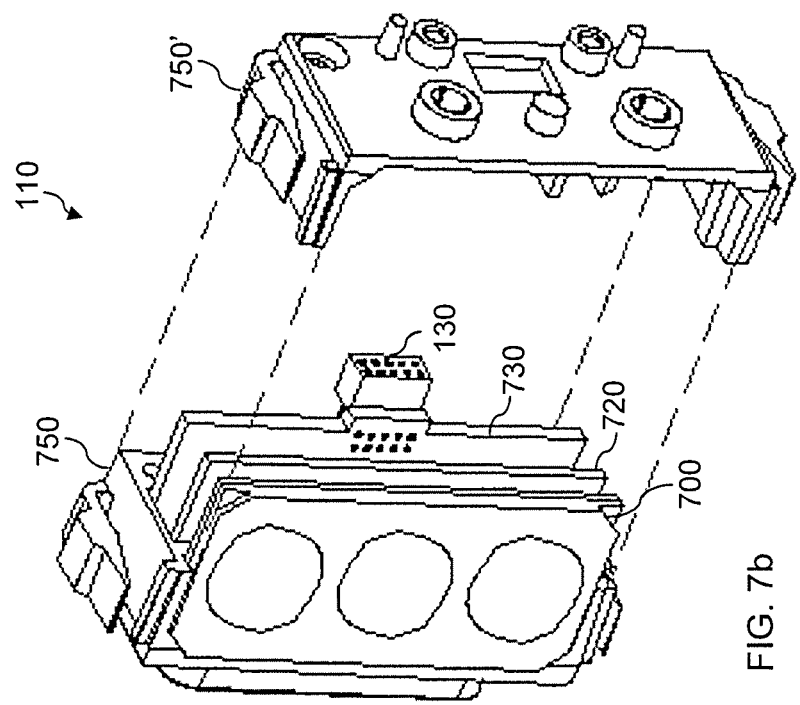
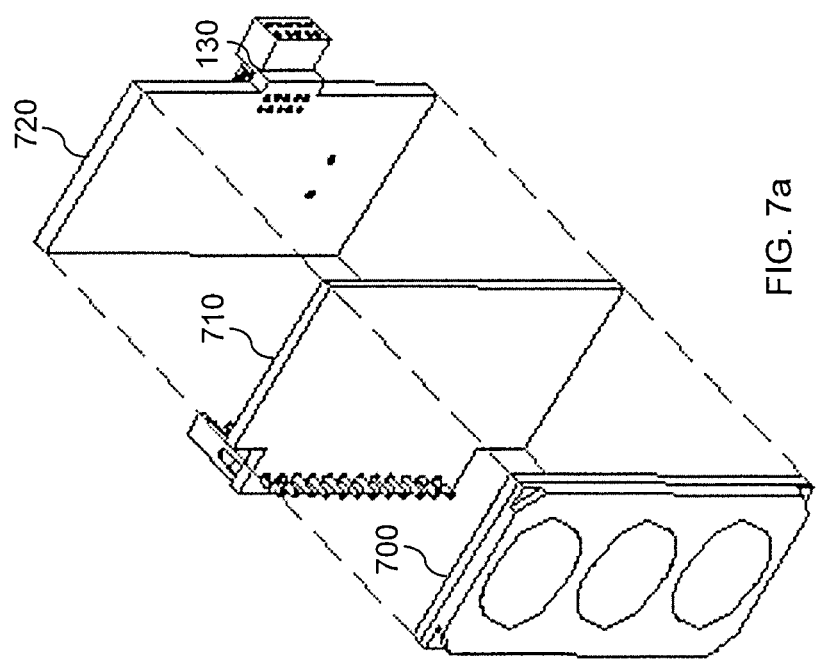

TOUCH ACTIVATED, WIRELESS SWITCHES

FIELD OF THE INVENTION

The present invention relates generally to a wireless switch module, and, more specifically, relates to a modular wireless switch system for use in an aircraft, having an integrated LED backlight.

BACKGROUND OF THE INVENTION

Aircraft and other complex vehicles include many systems which are controlled by the pilot or another crew member during operations. Such systems may provide any number of functions, including flight control and cabin environmental systems. Although some systems are located nearby to the pilot's controls, other systems are situated in remote locations of the aircraft.

Aircraft switch design, like the design of other aircraft components, is complicated by space, mounting, and weight requirements. In order to address these issues, aircraft systems may be designed to eliminate or reduce the number of certain components. Wiring in an aircraft, for example, may be reduced or eliminated by incorporating local wireless communications in some applications.

By using wireless switches, for example, it is possible to avoid routing and weight problems presented by traditional wiring, particularly where a switched system is disposed in a part of the aircraft remote from the switch.

However typical aircraft systems include many switched systems. Because of this, using a separate radio transceiver for each switch on a given panel can create design problems. These problems may include increased expense and/or increased complexity.

A particular problem in designing a system using multiple radio transceivers is radio interference. If each of a number of switches is communicating wirelessly within an aircraft, their signals may interfere with one another, potentially resulting in faulty or delayed switching.

Furthermore, the radio signals may interfere with the aircraft's internal and external communications, including voice and data communications. Because radio communications are critical to the operation of an aircraft, such interference could result in safety problems.

Another consideration in designing aircraft switches is usability. Despite automatic control systems in modern aircraft, the attention of a pilot is consumed by a heavy workload. Accordingly, visibility and ease of use are important design considerations.

It is therefore desired to provide a switching system that addresses these issues.

SUMMARY OF THE INVENTION

Accordingly, it is an object of the present invention to provide a modular wireless switching system. It is a further object of the present invention to provide a switching system that is easy to operate.

These and other objectives are achieved by providing an aircraft switch system that includes a master module having a power supply, a switch, and, a wireless communicator configured to communicate a switch state; and, a slave module connectable to the master module, which has a second switch and which is configured to communicate a second switch state using the wireless communicator.

In some implementations, a second slave module is connectable to the slave module, has a third switch, and is configured to communicate a third switch state using the wireless communicator.

The master module and the slave module may be connectable to a bus. Optionally, the slave module is configured to communicate the second switch state to the wireless communicator using the bus. Optionally, the slave module is configured to draw power from the power supply using the bus. Optionally, the bus complies with an I$^2$C protocol.

The master module may be connectable to an aircraft wiring harness, and the power supply is configured to draw power from the aircraft wiring harness.

The wireless communicator may include a radio transceiver. The wireless communicator may be configured to comprise at least a part of a WPAN, and may comply with an IEEE 802 standard. Optionally, the wireless communicator complies with a ZigBee, WiFi, or Bluetooth standard.

The wireless communicator may be configured to transmit a switch state to a switched device. Optionally, the master module may be configured to receive a device state from a device using the wireless communicator, and the slave module may be configured to receive a second device state from a second device using the wireless communicator. Optionally, the master and/or slave module may be configured to indicate a device state using an LED.

In some implementations, the switch is a touch-activated switch, and optionally may be a capacitive switch. The switch may be backlit, and there may be an overlay covering the switch. The overlay may be translucent, and may be illuminated by an LED. The LED may be configured to illuminate the overlay to indicate status information. This status information may include the switch state and/or a device state.

In some implementations, the slave module is connectable to the master module using alignment pegs. The alignment pegs may align an electrical connection between the master module and the slave module. A second slave module may also be connectable to the slave module using mounting pegs.

Other objects of the invention and its particular features and advantages will become more apparent from consideration of the following drawings and accompanying detailed description.

BRIEF DESCRIPTION OF THE DRAWINGS

FIGS. 7a and 7b are exploded views of a master module shown in FIG. 1.

DETAILED DESCRIPTION OF THE INVENTION

Figure 1:
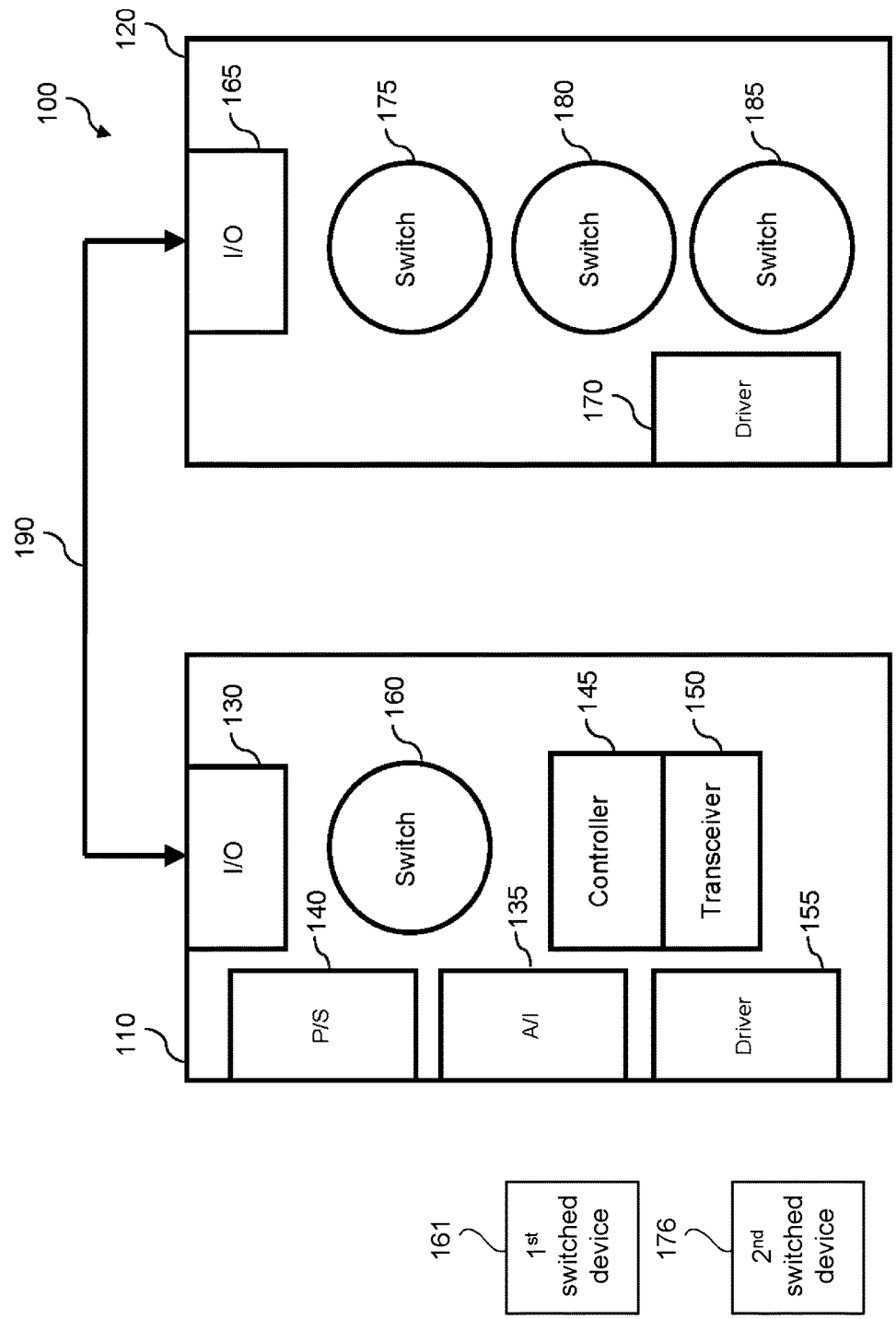
FIG. 1 is a schematic diagram illustrating an example switching system.

FIG. 1 is a schematic diagram illustrating an example switching system 100 according to aspects of the invention. Switching system 100 includes a master module 110 and a slave module 120.

Master module 110 includes an input/output ("I/O") interface 130, an aircraft interface 135, a power supply 140, a controller 145, a radio transceiver 150, a driver 155, and a switch 160.

Switch 160 may include any type of suitable switch known in the art. Preferably, switch 160 is a capacitive touch switch. When switch 160 is actuated, driver 155 transmits a switching signal to a first switched device 161 using transceiver 150. Optionally, driver 155 may receive an acknowledgement signal from the switched device via transceiver 150, which may optionally be used to activate a status indicator (not shown).

Transceiver 150 may include any type of suitable radio transceiver. Transceiver 150 may be configured to facilitate or become a party to a Wireless Personal Area Network ("WPAN"). Preferably, transceiver 150 is a small, inexpensive, low-power, digital transceiver that supports secure networking. Transceiver 150 may be based on an IEEE 802 standard for personal area networks, and preferably, transceiver 150 conforms to part or all of the ZigBee™ specification.

Aircraft interface 135 is configured to connect with an aircraft wiring harness (not shown) when installed in an aircraft, although those having skill in the art will understand that aircraft interface 135 may be adapted to or connected to other types of interfaces in various applications. Power supply 140 receives power from the harness via aircraft interface 135. Power supply 140 is configured to distribute power to the other components of master module 110. Optionally, the components of master module 110 may be designed to receive power directly from the harness via aircraft interface 135, in which case power supply 140 may be omitted.

Slave module 120 includes an input/output ("IO") interface 165, a driver 170, and switches 175, 180, 185. Slave module 120 communicates with master module 110 over bus 190 using I/O interfaces 165 and 130.

Bus 190 may be any suitable wired communications bus known in the art that is capable of communicating power and data. All of the powered components of slave module 120 may receive power from power supply 140 over bus 190. Communications over bus 190 may be controlled and arbitrated by controller 145. Bus 190 is preferably configured to operate under part or all of the Inter-Integrated Circuit™ ("I²C") or "two-wire" interface protocol.

Switches 175, 180, 185 may be any type of suitable switch known in the art, and may be identical or substantially identical to switch 160. When any of switches 175, 180, 185 are actuated, driver 170 transmits a switching signal to a second switched device 176 using transceiver 150. This switching signal is transmitted from a given switch 175, 180, 185 to transceiver 150 using bus 190. Optionally, driver 170 may receive an acknowledgement signal from the switched device via transceiver 150, which may optionally be used to activate a status indicator (not shown).

Figure 2:
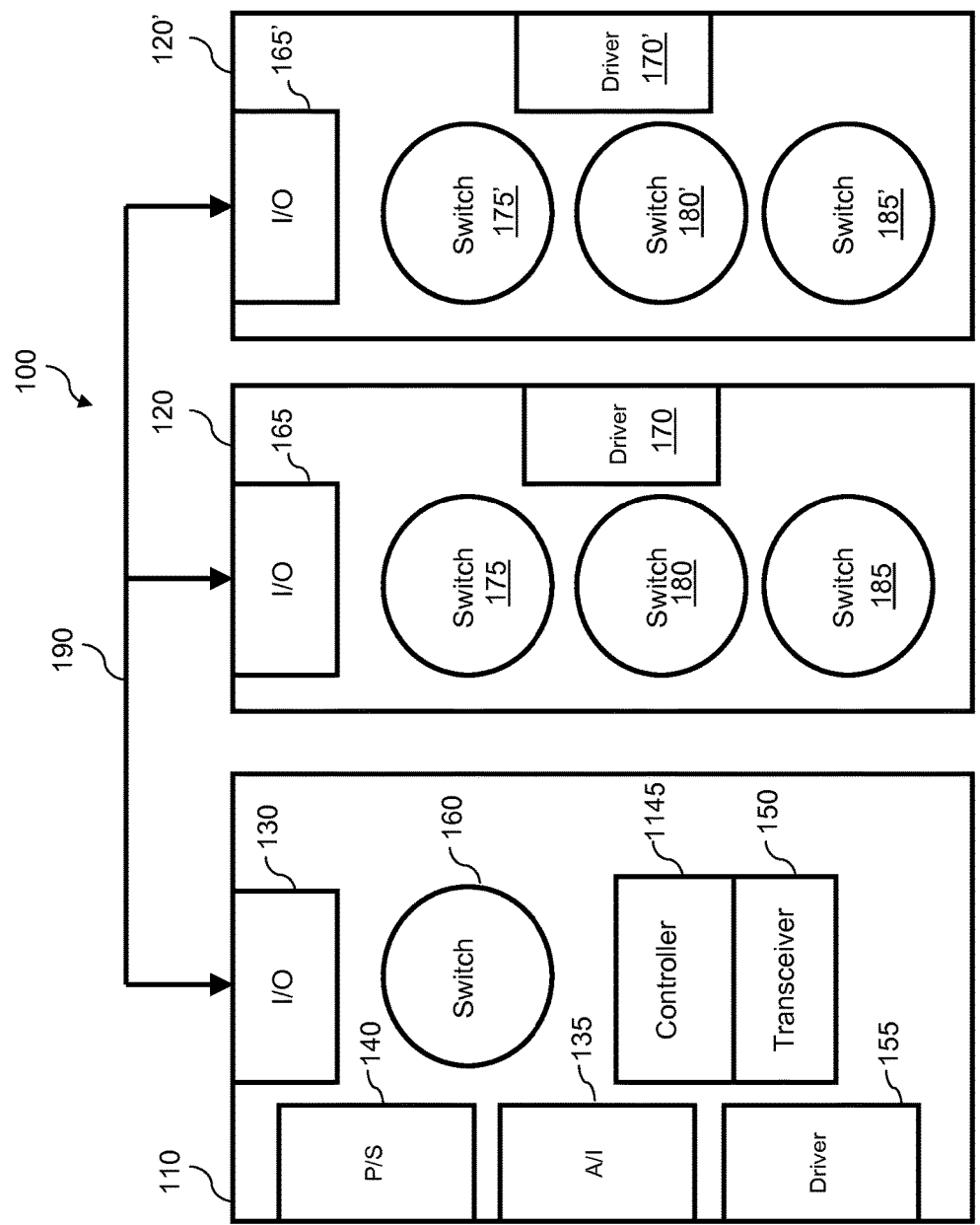
FIG. 2 is a schematic diagram of the switching system shown in FIG. 1, including additional features.

FIG. 2 is a schematic diagram of system 100, showing additional features according to aspects of the invention. Master module 110 and slave module 120 are shown configured in the same way as shown and described with respect to FIG. 1, except that an additional slave module 120' is in communication with bus 190.

Slave module 120 includes an I/O interface 165' and driver 175', and switches 175', 180', and 185'. Slave module 120' operates and communicates with master module 110 in the same way as slave module 120. Slave module 120' and/or its components may be identical or substantially identical to the slave module 120 and its corresponding components.

In principle, any desired number of additional slave modules (not shown) may be added to system 100, subject only to the limitations of the power and communications components of master module 110.

Figure 3C:
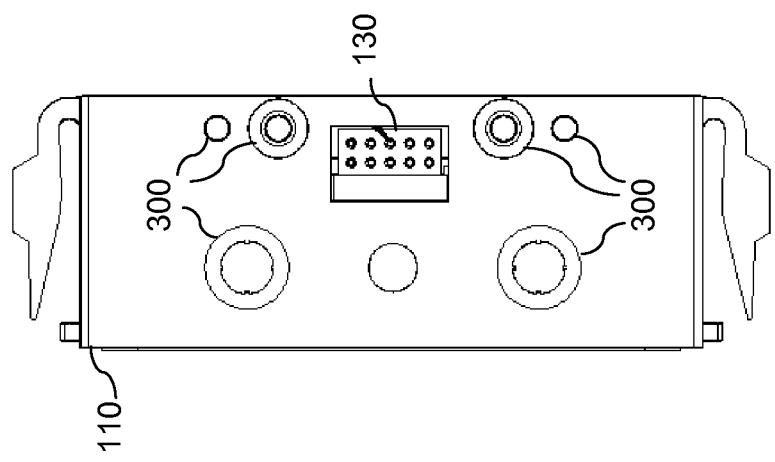
FIGS. 3a, 3b, and 3c are side and elevation views of a master module shown in FIG. 1.
Figure 3B:
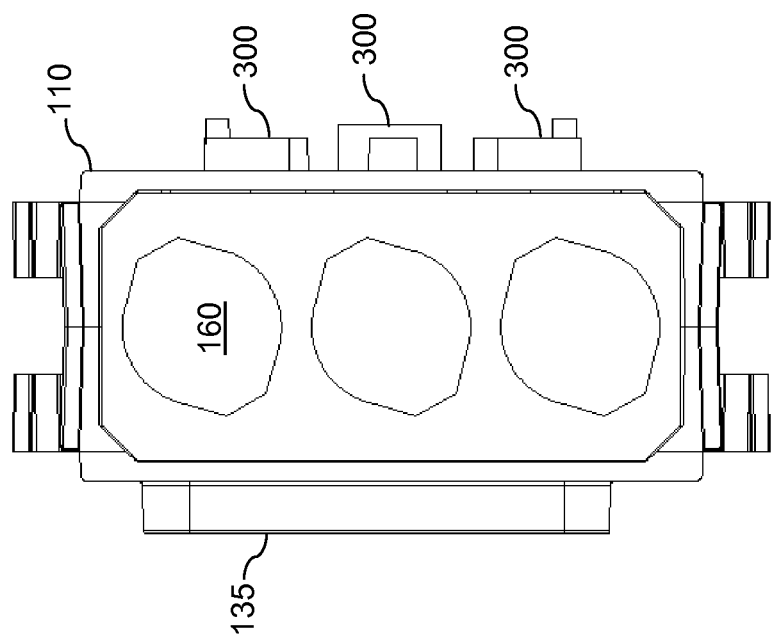
Figure 3A:
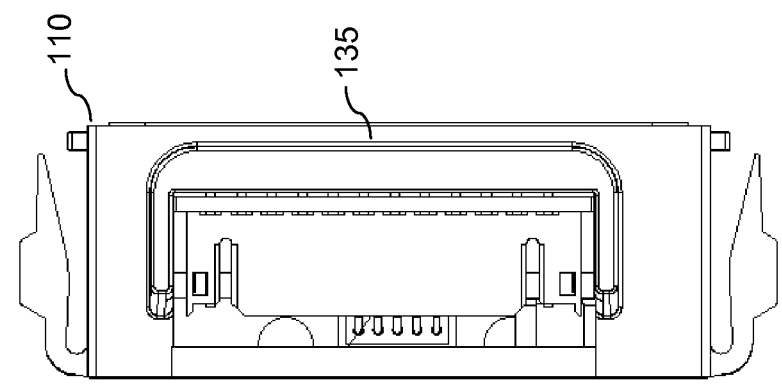

FIGS. 3a, 3b, and 3c are side and elevation views of master module 110 according to aspects of the invention. FIGS. 3b and 3c show alignment features 300 disposed on master module 110.

Figure 4C:
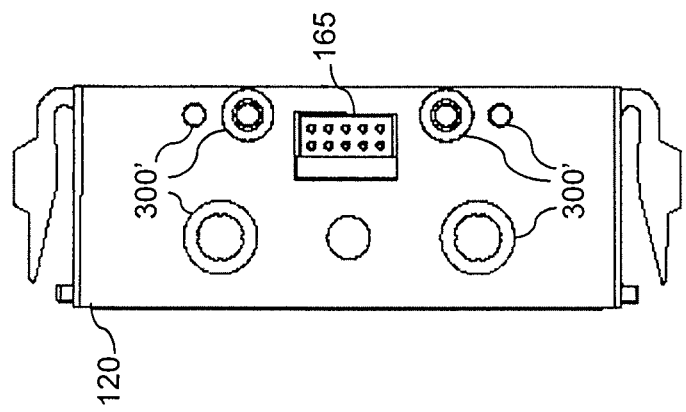
FIGS. 4a, 4b, and 4c are side and elevation views of a slave module shown in FIG. 1.
Figure 4B:
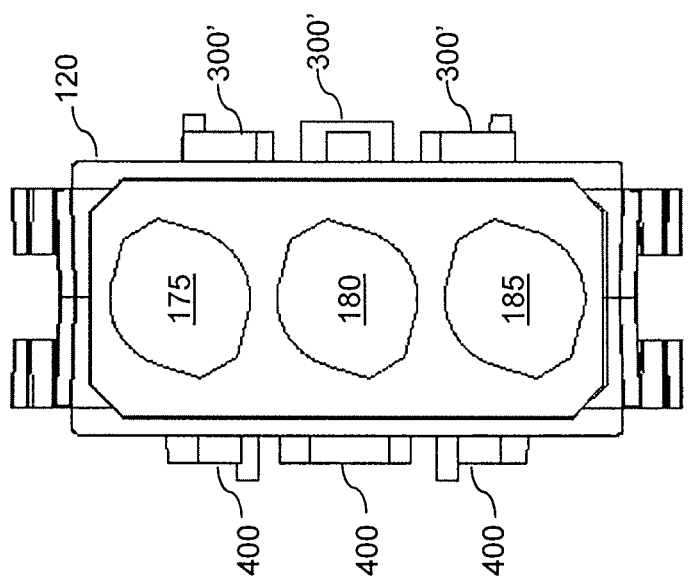
Figure 4A:
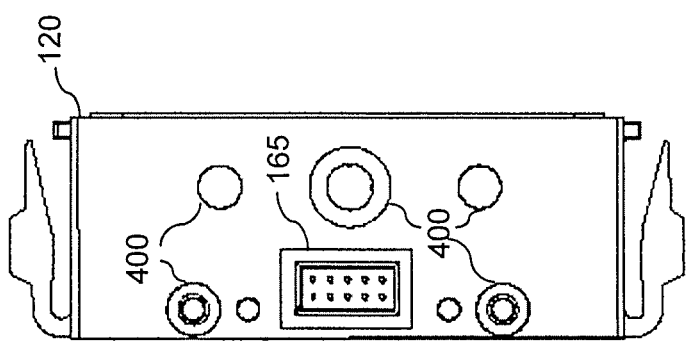

FIGS. 4a, 4b, and 4c are side and elevation views of master module 110 according to aspects of the invention. FIGS. 4b and 4c show alignment features 300' disposed on slave module 130 that are identical or substantially identical to alignment features 300 shown and described with respect FIGS. 3b and 3c. FIGS. 4a and 4b show alignment features 400 which are counterparts to features 300 and 300'.

Alignment features 300, 300', and 400 are constructed such that they assist in physically connecting slave module 120 to master module 110 and/or to other slave modules (e.g. 120' shown in FIG. 2). Optionally, alignment features 300, 300', and 400 are constructed such that they align I/O 130 with I/O 165 in a proper orientation. This can have the advantage of improving structural rigidity of the finished assembly, and of preventing damage to the I/O components during assembly or due to improper electrical connections. As shown in system 100, alignment features 300, 300' and 400 are implemented as peg-and-hole connectors. However, those having ordinary skill in the art will appreciate that other structures may be used.

Figure 5:
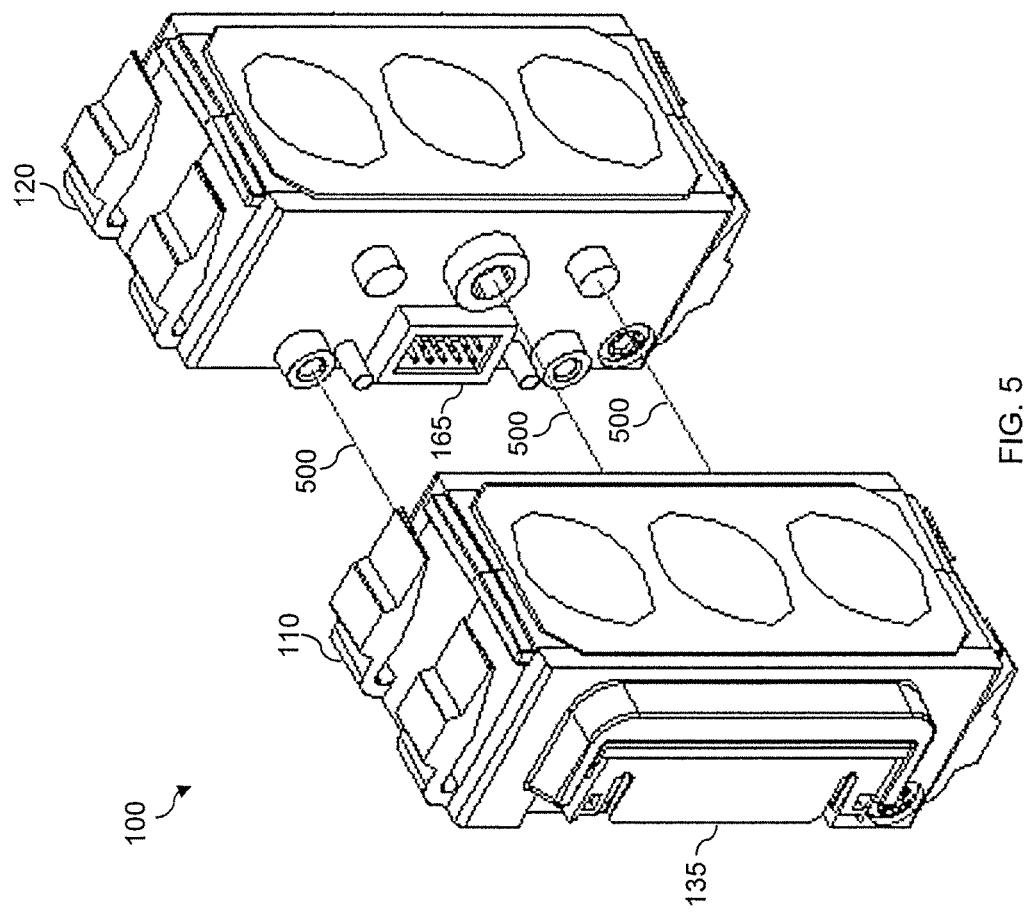
FIG. 5 is a partially exploded three-dimensional view of the system shown in FIG. 1.

FIG. 5 is a partially exploded three-dimensional view of system 100 according to aspects of the invention, illustrating an orientation for physically connecting master module 110 and slave module 120. Lines 500 indicate the axis of insertion of the various alignment features.

Figure 6:
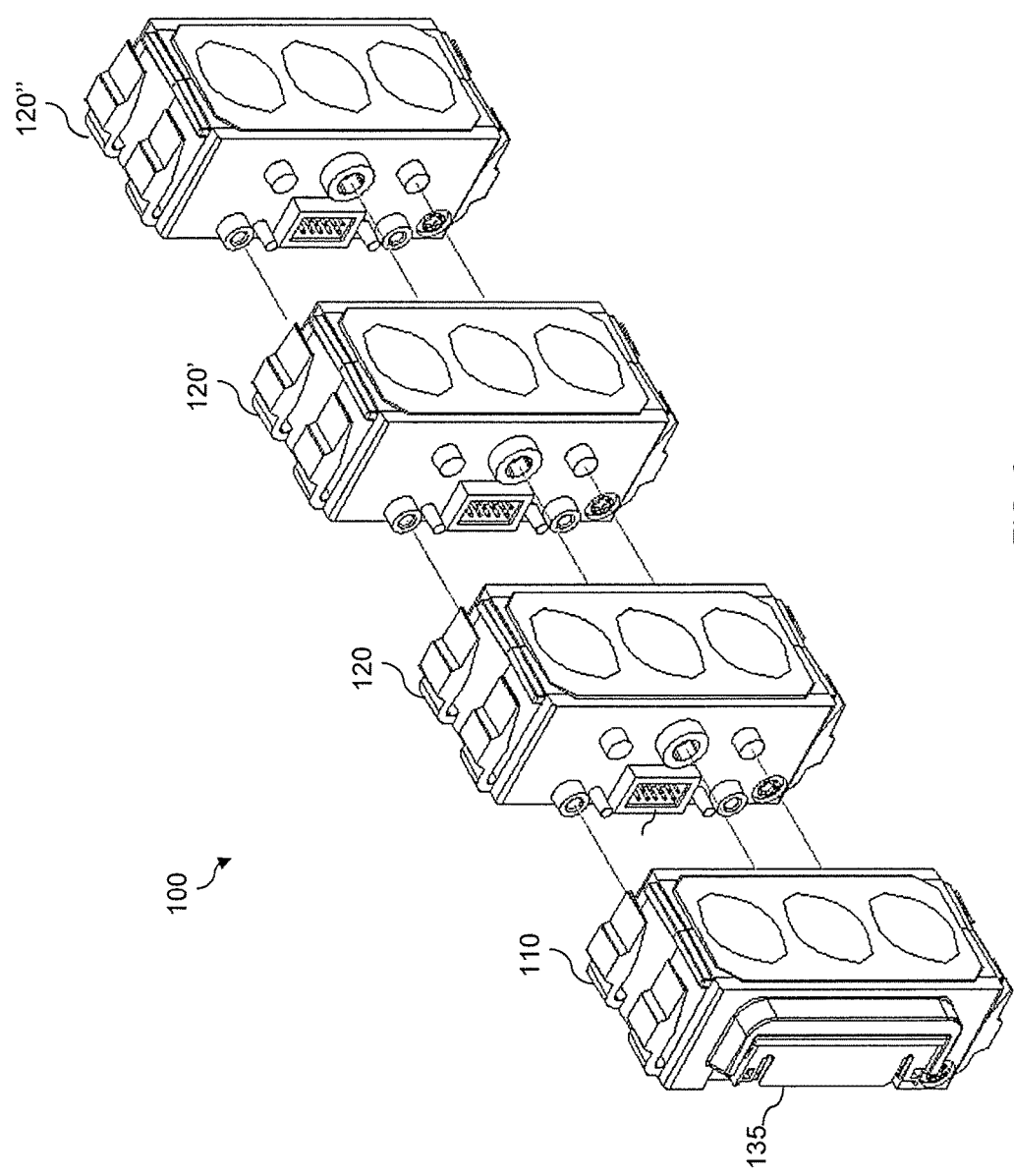
FIG. 6 is a partially exploded three-dimensional view of the system shown in FIG. 1, including additional features.

FIG. 6 is a partially exploded three-dimensional view of system 100 according to aspects of the invention, illustrating an orientation for connecting master module 110 and slave modules 120, 120' and 120".

FIGS. 5 and 6 illustrate system 100 as having the potential to provide a simple, robust, cost-effective, and modular switching panel by ganging together additional slave modules.

FIGS. 7a and 7b are exploded views of master module 110, illustrating one possible assembly according to aspects of the invention. Switch board 700 may include switch 160, and any other additional switches desired. Power board 710 may include aircraft interface 135, power supply 140, and driver 155. Control board 720 may include controller 145, transceiver 150, and I/O 130. Switch board 700, power board 710, and control board 720 may be assembled as shown within housing half-shells 750 and 750'. Those having skill in the art will understand that there are various ways of assembling and interconnecting these components without departing from the invention.

Figure 8B:
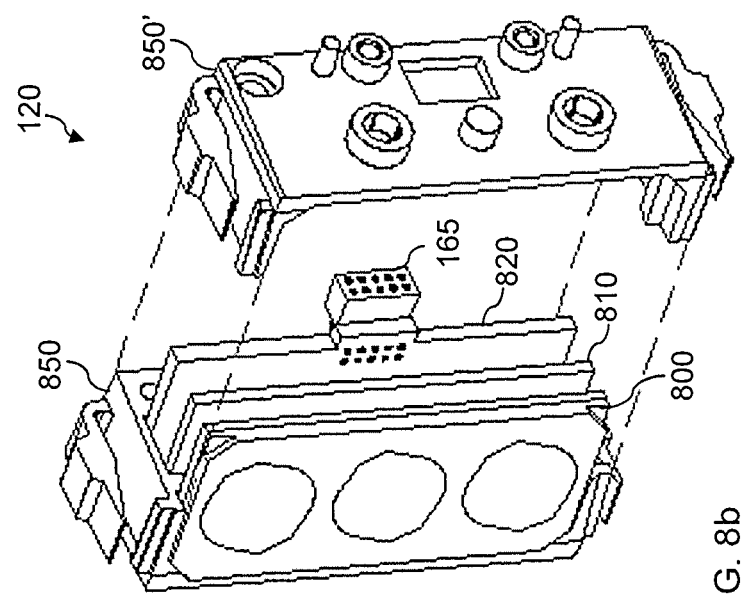
FIGS. 8a and 8b are exploded views of a slave module shown in FIG. 1.
Figure 8A:
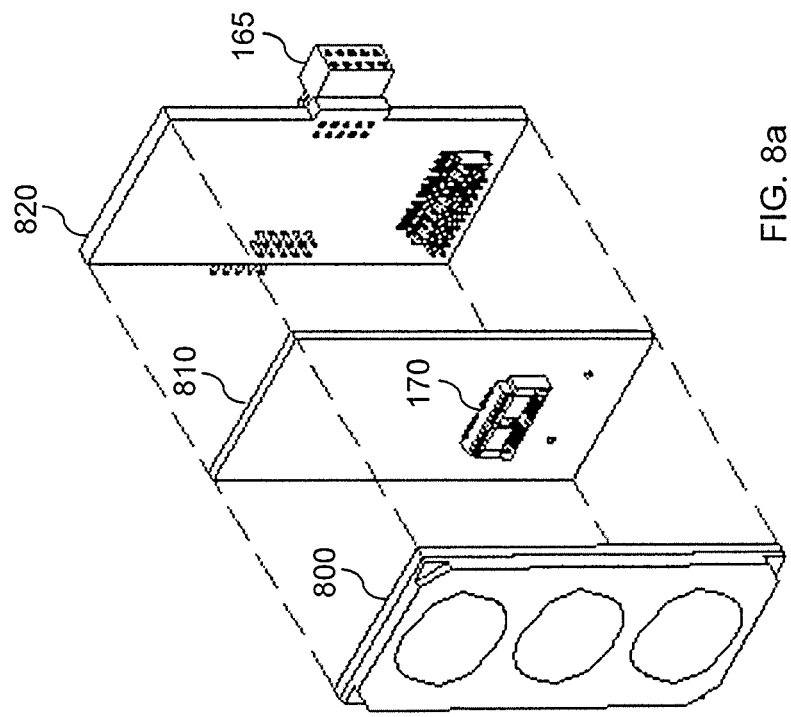

FIGS. 8a and 8b are exploded views of slave module 110, illustrating one possible assembly according to aspects of the invention. Switch board 800 may include switches 175, 180, 185. Switch board 800 may be identical or substantially identical to switch board 700. Driver board 810 may include driver 170. I/O board 820 may include I/O 165. Switch board 800, driver board 810, and I/O board 820 may be assembled as shown within housing half-shells 850 and 850'. Those having skill in the art will understand that there are various ways of assembling and interconnecting these components without departing from the invention.

Figure 9:
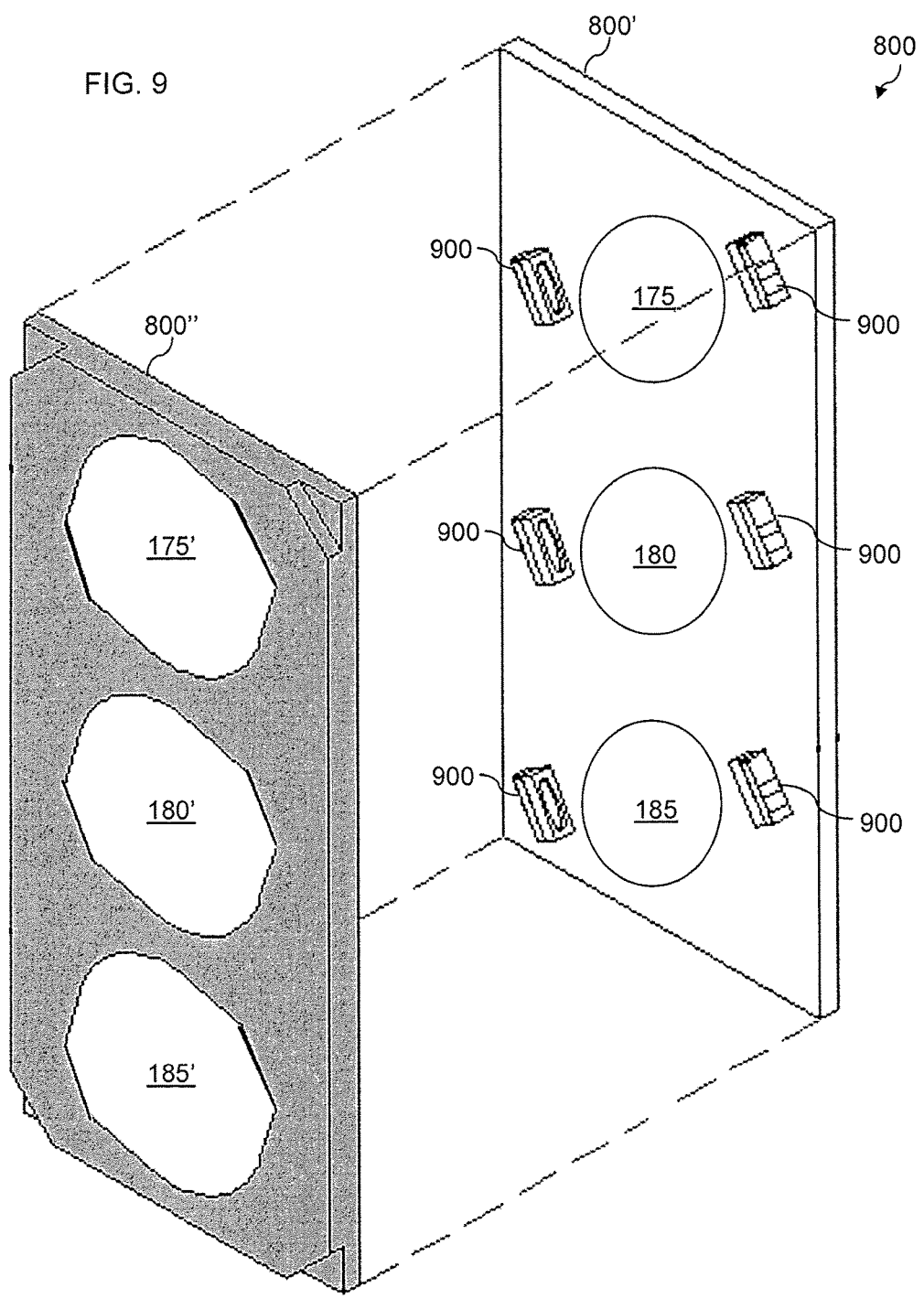
FIG. 9 is an exploded view of components of a module shown in FIG. 1.

FIG. 9 is an exploded view of switch board 800 according to aspects of the invention.

Switch board 800' includes switches 175, 180, 185, as well as LEDs 900. LEDs 900 may be side-firing LEDs, and are disposed such that they do not obstruct switches 175, 180, 185.

Diffuser panel 800" includes an opaque silicone holder 910 which is embedded with translucent silicone diffusers 175' 180' 185'.

When switch board 800' and diffuser panel 800" are assembled, silicon diffusers 175' 180' 185' can transmit and diffuse light from LEDs 900, while holder 910 blocks substantially all light from LEDs 900, preventing light leakage from one illuminated area to another. Diffuser panel 800" may be adhered to switch board 800' to form switch board 800. Pockets (not shown) are molded into diffuser panel 800" such that LEDs 900 project into diffuser panel 800 in a manner configured to project light into the diffusers 175' 180' 185', illuminating the switches 175, 180, 185.

LEDs 900 receive power from driver 170. The intensity or color of LEDs 900 may be varied by controller 145 to reflect the switch state or status of the switched device (not shown) depending upon the desired implementation.

Although the invention has been described with reference to a particular arrangement of parts, features and the like, these are not intended to exhaust all possible arrangements or features, and indeed many modifications and variations will be ascertainable to those of skill in the art.

What is claimed is:

1. A switch system comprising:
    a master module which comprises:
        an aircraft interface,
        a power supply,
        a first driver,
        a first switch,
        first I/O interface and,
        a transceiver that is configured to communicate a state of said first switch to a first switched device,
        a controller, and,
    a first slave module connected to the master module and comprising a second switch, a second driver and a second I/O interfaces, wherein said transceiver is configured to communicate a state of the second switch to a second switched device;
    a second slave module connectable to said first slave module and comprising a third switch a third driver and a third I/O interface and which is configured to communicate a third switch state using the transceiver to its respective switched device;
    wherein the communication of the various states of said first, second and third switches comprises transmitting a status of at least one of the switches to its associated device such that the associated device is activated when its respective switch is activated;
    wherein the master module, the first slave module and second slave modules are connected to a bus through the first I/O interface such that said first slave module communicates the state of the second switch to said transceiver via the bus and said controller controls communication over the bus; and
    wherein the first slave module draws power from the power supply using the bus and the master module is connectable to an aircraft wiring harness via the aircraft interface, and the power supply is configured to draw power from the aircraft wiring harness.

2. The switch system of claim 1, wherein the bus complies with an $I^2C$ protocol.

3. The switch system of claim 1, wherein the transceiver comprises a radio transceiver.

4. The switch system of claim 1, wherein the transceiver is configured to comprise at least a part of a Wireless Personal Area Network ("WPAN").

5. The switch system of claim 1, wherein the transceiver complies with at least one of: IEEE 802.11, IEEE 802.15.1 or IEEE 802.15.4.

6. The switch system of claim 1, wherein the master module is configured to receive a device state from the first switched device using the transceiver.

7. The switch system of claim 1, wherein the first slave module is configured to receive a second device state from the second switched device using the transceiver.

8. The switch system of claim 6, wherein the master module is configured to indicate the device state using an LED.

9. The switch system of claim 1, wherein at least one of the switches is a touch-activated switch.

10. The switch system of claim 1, wherein at least one of the switches is a capacitive switch.

11. The switch system of claim 1, wherein at least one of the switches is backlit.

12. The switch system of claim 1, further comprising an overlay covering at least one of the switches.

13. The switch system of claim 12, wherein the overlay is translucent.

14. The switch system of claim 12, wherein the overlay is illuminated by an LED.

15. The switch system of claim 12, further comprising an LED configured to illuminate the overlay to indicate status information.

16. The switch system of claim 15, wherein the status information is selected from the group consisting of the switch state and the device state.

17. The switch system of claim 1, wherein the first slave module is attachable to the master module using mounting pegs.

18. The switch system of claim 1, wherein a second slave module is attachable to the first slave module using mounting pegs.

19. The switch system of claim 17, wherein the mounting pegs are configured to align an electrical connection between the master module and the first slave module.

20. The switch system of claim 1, wherein said controller is mounted on a control board in said master module.

* * * * *